United States Patent
Moran et al.

(10) Patent No.: US 7,689,122 B2
(45) Date of Patent: Mar. 30, 2010

(54) POLARITY-INSENSITIVE SIGNAL DETECT CIRCUIT FOR USE WITH ANY SIGNAL SEQUENCE

(75) Inventors: Tim Moran, San Jose, CA (US); Greta Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 726 days.

(21) Appl. No.: 11/072,788

(22) Filed: Mar. 4, 2005

(65) Prior Publication Data
US 2005/0194996 A1 Sep. 8, 2005

Related U.S. Application Data

(60) Provisional application No. 60/550,577, filed on Mar. 5, 2004.

(51) Int. Cl.
*H04B 7/00* (2006.01)
(52) U.S. Cl. ............... 398/64; 455/513; 455/572; 455/574; 455/514
(58) Field of Classification Search ........... 455/513, 455/514
See application file for complete search history.

(56) References Cited

U.S. PATENT DOCUMENTS

| | | | | |
|---|---|---|---|---|
| 5,381,108 A | * | 1/1995 | Whitmarsh et al. | 330/2 |
| 5,815,298 A | * | 9/1998 | Cern | 398/16 |
| 6,252,692 B1 | * | 6/2001 | Roberts | 398/147 |
| 2002/0113652 A1 | * | 8/2002 | Uto et al. | 330/259 |
| 2006/0002709 A1 | * | 1/2006 | Dybsetter et al. | 398/135 |

* cited by examiner

*Primary Examiner*—Duc Nguyen
*Assistant Examiner*—Adel Youssef
(74) *Attorney, Agent, or Firm*—Workman Nydegger

(57) ABSTRACT

A signal detect circuit includes a signal strength measuring differential output linear amplifier. A positive peak detection circuit is coupled to the positive output terminal of the linear amplifier and generates a signal that represents a peak magnitude of a signal received from the positive output terminal. Likewise, a negative peak detection circuit is coupled to the negative output terminal of the linear amplifier and generates a signal that represents a peak magnitude of a signal received from the negative output terminal. Upon power up of the signal detect circuit, a comparison circuit detects when the positive and negative peak signal magnitudes has both exceed respective values at least once. Once this occurs, the comparison circuit compares an interpolation of the positive peak signal and the negative peak signal with the value. If the interpolated signal falls below the value, the comparison circuit generates a signal representing that no signal is being received.

19 Claims, 2 Drawing Sheets

POLARITY-INSENSITIVE SIGNAL DETECT CIRCUIT FOR USE WITH ANY SIGNAL SEQUENCE

CROSS-REFERENCE TO RELATED APPLICATIONS

This application claims the benefit of U.S. Provisional Application No. 60/550,577 filed Mar. 5, 2004, which is incorporated herein by reference in its entirety.

BACKGROUND OF THE INVENTION

1. The Field of the Invention

The present invention relates generally to electronic circuitry. More particularly, embodiments of the present invention relate to mechanisms for detecting the presence of received signals using a signal strength measuring differential output linear amplifier.

2. Background and Relevant Art

The ability to remotely communicate information using electronic and optical signals has contributed to monumental advancements in our ability to collaborate and access information. Communication is enabled by a transmitter at one node in a network transmitting information over a medium to a receiver at another node. Often, it is appropriate for a receiver to take one course of action if a signal is being received, and quite a different course of action if a signal is not being received. Accordingly, receivers often have a signal detect circuit that allows the receiver to detect whether or not a signal is being received.

In high speed networks, information is communicated at high frequencies. For instance, optical networks are capable of operating at frequencies in the Gigahertz range with anticipated future capabilities entering even the Terahertz range. Accordingly, circuits designed for only for low speed applications may not be suitable for optical transceivers. For instance, an optical signal detect circuit must be especially suitable for high speed applications.

Some signal detect circuits have difficulty detecting the difference between series of low states and a no signal state. Accordingly, it may be possible for a signal detect signal to give a false indication of a no signal state given certain received signal sequences. Furthermore, signal detect circuits may be sensitive to how the module is connected. For example, when receiving a differential signal, one of the signals should be coupled to a specific input terminal of the transceiver, while the other signal should be coupled to the other input terminal. The signal detect circuit may be specifically designed to work with this connection polarity. If the polarity is reversed, the signal detect circuit may not work due to the offset inherent in some of the amplifiers and/or comparators present in the signal detect circuit.

Accordingly, what would be advantageous is a signal detect circuit that is not sensitive to polarity, and which accurately detects a no signal state regardless of the signal sequence received. It would be further advantageous if the signal detect circuit was suitable for high speed communications.

BRIEF SUMMARY OF THE INVENTION

The foregoing problems with the prior state of the art are overcome by the principles of the present invention, which are directed towards a signal detect circuit for use in detecting whether or not there is an incoming signal. The signal detect circuit is not sensitive to connection polarity, nor to any given signal sequence. Furthermore, the signal detect circuit may operate at high speeds thus being suitable for optical communications.

The signal detect circuit includes a signal strength measuring differential output linear amplifier having a positive and a negative output terminal. A positive peak detection circuit is coupled to the positive output terminal of the linear amplifier and generates a signal that represents a peak magnitude of a signal received from the positive output terminal of the linear amplifier. A negative peak detection circuit is coupled to the negative output terminal of the linear amplifier and generates a signal that represents a peak magnitude of a signal received from the negative output terminal of the linear amplifier.

Furthermore, upon power up of the signal detect circuit, a comparison circuit detects when the positive and negative peak signal magnitudes has both exceeded respective threshold values at least once. Once this occurs, the comparison circuit compares an interpolation of the positive peak signal and the negative peak signal with the value. If the interpolated signal falls below the value, then the comparison circuit generates a signal representing that no signal is being received.

The signal detect circuit is not sensitive to long sequences of low signals since the interpolation of the peak magnitudes would still be above the threshold value, and thus the signal detect circuit would not falsely diagnose a no signal state because of this signal sequence. Furthermore, the circuit is substantially functionally symmetric, particularly if the linear amplifier is configured to have its offset at least partially nullified. Accordingly, the signal detect circuit is not sensitive to polarity. In addition, since the signal detect functioning really does not start until both the positive and negative peak magnitudes have reached a certain threshold (i.e., until the signal detect circuit has completed power up) false no signal diagnoses due to transient start up conditions are avoided.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention relate to a signal detect circuit for use in detecting whether or not there is an incoming signal. The signal detect circuit is not sensitive to connection polarity nor to any given signal sequence. Furthermore, the signal detect circuit is suitable for high speed applications and thus may be employed for fibre-optic communications.

Figure 1:
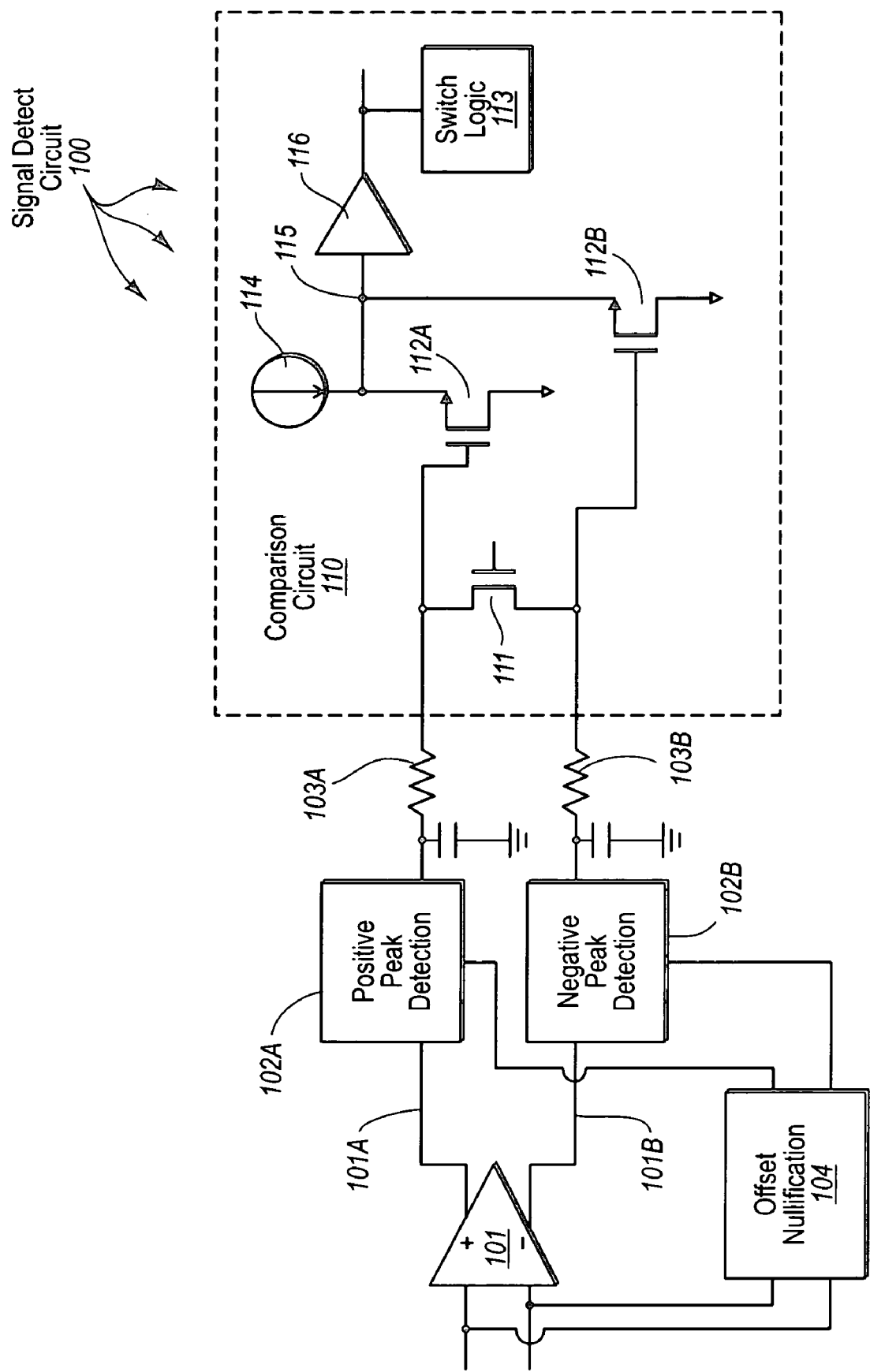
FIG. 1 is a circuit diagram of a signal detect circuit in accordance with the principles of the present invention.

Turning to the drawings, FIG. 1 illustrates a circuit diagram of a signal detect circuit 100 in accordance with the principles of the present invention. The signal detect circuit 100 includes a differential output linear amplifier 101 that includes a positive output terminal 101A and a negative output terminal 101B. The differential output linear amplifier 101 is used in a receiver, and is configured within the receiver to generate signals at its output terminals that is approximately proportional to the signal strength received at the receiver. The configuration of a linear amplifier to accomplish this is know in the art and thus will not be detailed herein.

The signal detect circuit 100 also includes a positive peak detection circuit 102A and a negative peak detection circuit 102B. The positive peak detection circuit 102A is coupled to the positive output terminal 101A of the linear amplifier 101. Furthermore, the positive peak detection circuit 102A generates a signal at its output terminal 103A that represents a peak magnitude of the signal received from the positive output terminal 101A of the linear amplifier 101. Similarly, the negative peak detection circuit 102B is coupled to the negative output terminal 101B of the linear amplifier 101, and generates a signal that represents a peak magnitude of the signal received from the negative output terminal 101B of the linear amplifier 101.

The term "peak magnitude" of a signal is not intended to means the greatest magnitude that the signal has ever been. Instead, there is some bleeding off of charge in the peak detectors. For example, the peak detectors may include a diode whose anode terminal receives the input terminal of the peak detector. A capacitor and a resistor are coupled in parallel between the cathode terminal of the diode and a lower voltage reference. The diode may be a low voltage drop diode such that the capacitor is charged to a peak voltage value when a high voltage signal is received. As time passes, the charge is bled off through the resistor until another voltage is received that exceeds the voltage maintained by the capacitor.

Upon power up of the signal detect circuit 100, a comparison circuit 110 detects when the positive and negative peak signal magnitudes has both exceed respective values at least once. Once this occurs, the comparison circuit 110 compares an interpolation (e.g., an approximate average) of the positive peak signal and the negative peak signal with the threshold value. If the interpolated signal falls below the value, then the comparison circuit generates a signal representing that no signal is being received.

An example circuit that supports this comparison functionality is illustrated within the comparison circuit 110. However, this is just an example. Any comparison circuit that accomplishes the function recited for the comparison circuit 110 is contemplated as being within the scope of the present invention. In the specific example, a field effect transistor 111 serves as a switch that selectively couples the output terminal 103A of the positive peak detection circuit 102A with the output terminal 103B of the negative peak detection circuit 102B.

A p-type field effect transistor 112A has its gate terminal coupled to the output terminal 103A of the positive peak detection circuit 102A. Another p-type field effect transistor 112B has its gate terminal coupled to the output terminal 103B of the negative peak detection circuit 102B. A current source 114 feeds current through the channel regions of the p-type field effect transistors 112A and 112B.

Initially during power up of the signal detect circuit 100, the switch 111 is open. In this configuration, the voltage at the node 115 follows whichever of the peak magnitudes is lower. The node 115 serves as an input terminal to a comparator 116, which compares the voltage with a reference voltage. Once both the positive and negative peak magnitudes exceed the threshold value, the comparator will change it output state. This will cause the switch logic 113 to close the switch 111.

From that point forward, the voltage at the node 115 will follow an interpolation (e.g., an average) between the positive peak magnitude and the negative peak magnitude. The switch logic 113 also causes the comparison circuit 110 to from that point forward detect whether or not that interpolation is above a certain threshold value. If the interpolation falls below the threshold value, then a no signal condition has occurred. The signal detect circuit 110 also may include offset nullification circuitry 104 which reduces the offset of the linear amplifier 101.

The signal detect circuit is not sensitive to long sequences of low signals since the interpolation of the peak magnitudes would still be above the threshold value, and thus the signal detect circuit would not falsely diagnose a no signal state because of this signal sequence. Furthermore, the circuit is substantially functionally symmetric, particularly if the linear amplifier is configured to have its offset at least partially nullified. Accordingly, the signal detect circuit is not sensitive to connection polarity. In addition, since the signal detect functioning really does not start until both the positive and negative peak magnitudes have reached a certain threshold (i.e., until the signal detect circuit has completed power up) false no signal diagnoses due to transient start up conditions are avoided.

Figure 2:
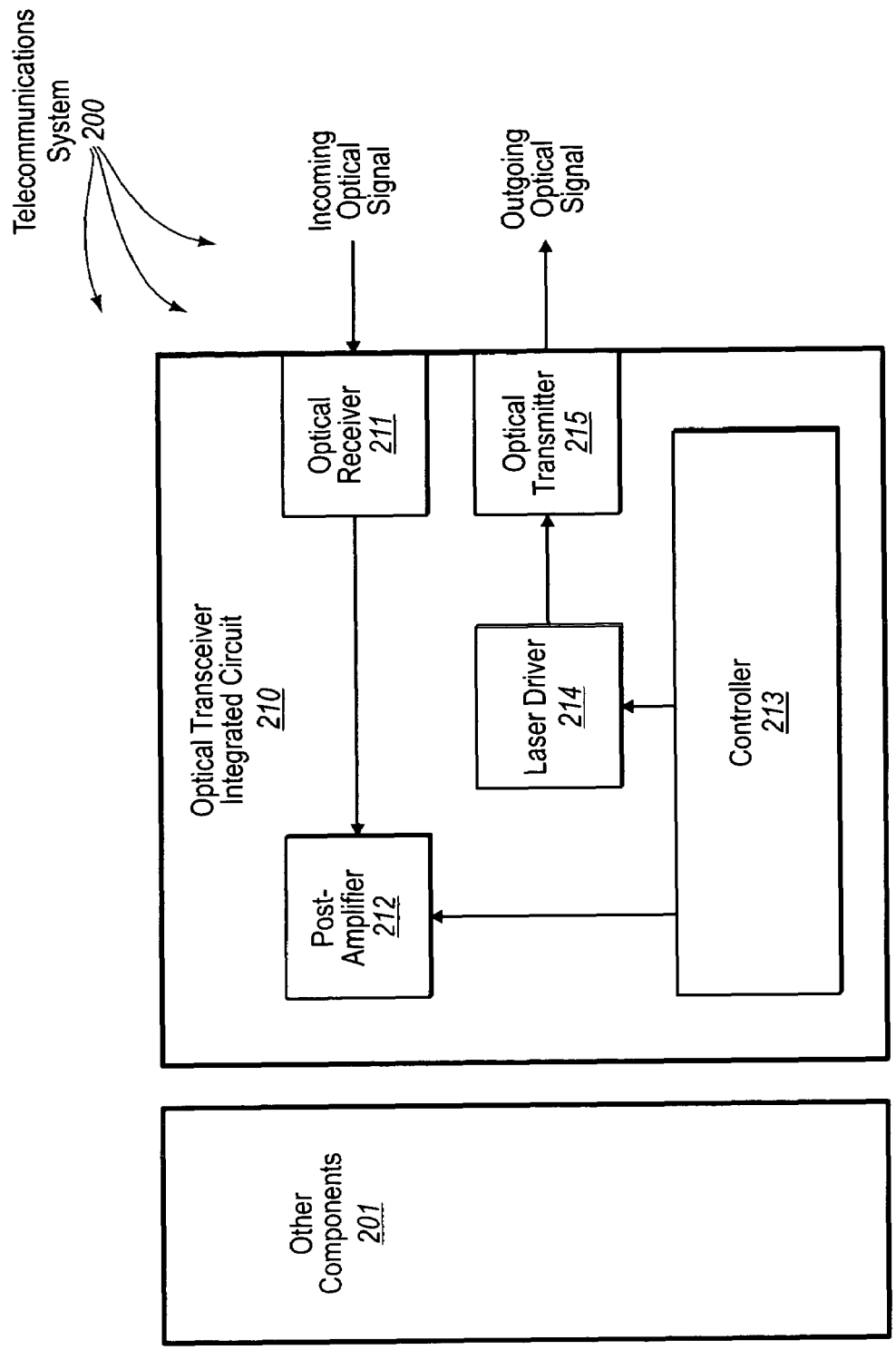
FIG. 2 schematically illustrates a telecommunication system and associated optical transceiver in which the circuit diagram of FIG. 1 is employed.

Having described an example of a signal detect circuit in accordance with FIG. 1, an example environment in which the signal detect circuit may be incorporated will now be described with respect to FIG. 2. FIG. 2 schematically illustrates a telecommunication system and associated optical transceiver that may incorporate the signal detect circuit.

The optical transceiver integrated circuit 210 operates to receive an incoming optical signal and report the signal to the other components 201. Specifically, an optical receiver 211 receives the incoming optical signal and converts the optical signal into a corresponding electrical signal. The electrical signal is then provided to a post-amplifier 212 for appropriate amplification. The resulting electrical signal may then be used by, for example, a host computing system. The other components 201 may include the host computing system that uses the incoming signal.

The optical transceiver integrated circuit 210 also operates to transmit outgoing optical signals in response to instructions from a host computing system. A laser driver 214 properly interprets these instructions to provide an appropriate electrical signal to an optical transmitter 215. The optical transmitter 215 converts the electrical signal into an optical signal for transmission.

The post-amplifier 212 and the laser driver 214 are controlled by a controller 213, which configures the post-amplifier 212 and laser drivers 214 with appropriate settings. In some cases, the controller 213 may be sophisticated enough to dynamically adjust the settings for the post-amplifier 212 and laser driver 214 given changing operational circumstances.

The controller 213 may be integrated onto the same integrated circuit as the post-amplifier 212 and laser driver 214, although this is not required. The signal detect circuit 100 of FIG. 1 may be incorporated into any appropriate part of the optical transceiver 210, whether illustrated or otherwise.

Accordingly, a specific environment in which the signal detect circuit 100 of FIG. 1 may operate has been described. It should be noted that while some embodiments of the invention are well-suited for use in conjunction with a high speed data transmission system conforming to the Gigabit Ethernet ("GigE") physical specification, such operating environment is exemplary only and embodiments of the invention may, more generally, be employed in any of a variety of high speed data transmission systems, some of which may have line rates up to, or exceeding, 1 G, 2.5 G, 4 G, 10 G and higher bandwidth fiber channels. For example, some embodiments of the invention are compatible with the Fibre Channel ("FC") physical specification.

Further, embodiments of the invention may be implemented in various ways. By way of example, some embodiments of the PA/LD are implemented in Small Form Factor Pluggable ("SFP") bi-directional transceiver modules. Such transceiver modules are configured for GigE and/or FC compliance. Exemplarily, such transceiver modules are capable of transmitting and/or receiving at a wavelength of about 850 nm. Moreover, these transceiver modules can operate over a wide range of temperatures. For example, some of such transceiver modules are effective over a temperature range of about 80° C., such as from about −10° C. to about +70° C. Of course, such embodiments and associated operating parameters are exemplary only, and are not intended to limit the scope of the invention in any way. For example, the principles of the present invention may be implemented in laser transmitter/receivers of any form factor such as XFP, SFP and SFF, without restriction.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical transceiver comprising:
   an optical receiver;
   an optical transmitter; and
   a signal detect circuit comprising the following:
      a signal strength measuring differential output linear amplifier having a positive and a negative output terminal;
      a positive peak detection circuit coupled to the positive output terminal of the linear amplifier, wherein the positive peak detection circuit is configured to generate on its output terminal a positive peak signal that represents a peak magnitude of a peak of a signal received from the positive output terminal of the linear amplifier;
      a negative peak detection circuit coupled to the negative output terminal of the linear amplifier, wherein the negative peak detection circuit is configured to generate on its output terminal a negative peak signal that represents a peak magnitude of a peak of a signal received from the negative output terminal of the linear amplifier; and
      a comparison circuit configured, upon power up, to detect when the positive peak signal magnitude has exceeded a first value and when the negative peak signal magnitude has exceeded a second value, wherein the comparison circuit is further configured to thereafter compare an interpolation of the positive peak signal and the negative peak signal with a third value, wherein the comparison circuit is configured to generate a signal representing that no signal is being received at the signal strength measuring differential output linear amplifier if the interpolation is below the third value.

2. An optical transceiver in accordance with claim 1, wherein the first value and the second value are the same.

3. An optical transceiver in accordance with claim 2, wherein the first value and the third value are the same.

4. An optical transceiver in accordance with claim 1, wherein the second value and the third value are the same.

5. An optical transceiver in accordance with claim 1, wherein the linear amplifier has a feedback loop that tends to nullify offset of the linear amplifier.

6. An optical transceiver in accordance with claim 1, wherein the comparison circuit further comprises a switch that couples the output terminal of the positive peak detection circuit with the output terminal of the negative peak detection circuit, wherein the comparison circuit is configured to have the switch open until both the positive peak signal magnitude is detected to exceed the first value and the negative peak signal magnitude is detected to exceed the second value.

7. An optical transceiver in accordance with claim 1, wherein the optical transceiver is part of a telecommunications system.

8. An optical transceiver in accordance with claim 1, wherein the optical transceiver is a 1 G optical transceiver.

9. An optical transceiver in accordance with claim 1, wherein the optical transceiver is a 2.5 G optical transceiver.

10. An optical transceiver in accordance with claim 1, wherein the optical transceiver is a 4 G optical transceiver.

11. An optical transceiver in accordance with claim 1, wherein optical transceiver is a 10 G laser transceiver.

12. An optical transceiver in accordance with claim 1, wherein the optical transceiver is suitable for fiber channels greater than 10 G.

13. An optical transceiver in accordance with claim 1, wherein the optical transceiver is part of an XFP laser transceiver.

14. An optical transceiver in accordance with claim 1, wherein the optical transceiver is part of an SFP laser transceiver 15. An optical transceiver in accordance with claim 1, wherein the optical transceiver is part of an SFF laser transceiver.

16. An optical transceiver comprising: a signal detect circuit comprising the following: a signal strength measuring linear amplifier having a positive and a negative output terminal, wherein the signal strength measuring amplifier receives an input signal; a positive peak detection circuit coupled to the positive output terminal of the linear amplifier, wherein the positive peak detection circuit is configured to generate on its output terminal a positive peak signal that represents a peak magnitude of a peak of a signal received from the positive output terminal of the linear amplifier; a negative peak detection circuit coupled to the negative output terminal of the linear amplifier, wherein the negative peak detection circuit is configured to generate on its output terminal a negative peak signal that represents a peak magnitude of a peak of a signal received from the negative output terminal of the linear amplifier; and a comparison circuit configured, upon power up, to detect when the positive peak signal magnitude has exceeded a first value and when the negative peak signal magnitude has exceeded a second value, wherein the comparison circuit is further configured to thereafter compare an interpolation of the positive peak signal and the negative peak signal with a third value, wherein the comparison circuit generates a signal representing that the input signal is not being received if the interpolation is below the third value.

17. The optical transceiver of claim 16, wherein the comparison circuit further comprises;
   a switch that couples the output terminal of the positive peak detection circuit with the output terminal of the negative peak detection circuit after the positive peak signal magnitude and the negative peak signal magnitude independently exceed the corresponding first and second values and a comparator that compares the interpolation with the third value.

18. The optical transceiver of claim 16, further comprising an offset nullification signal to reduce an offset of the signal strength measuring amplifier.

19. An optical transceiver comprising a signal detect circuit comprising: a signal strength measuring differential output linear amplifier having a positive and a negative output terminal;

a positive peak detection circuit coupled to the positive output terminal of the linear amplifier, wherein the positive peak detection circuit is configured to generate on its output terminal a positive peak signal that represents a peak magnitude of a peak of a signal received from the positive output terminal of the linear amplifier;

a negative peak detection circuit coupled to the negative output terminal of the linear amplifier, wherein the negative peak detection circuit is configured to generate on its output terminal a negative peak signal that represents a peak magnitude of a peak of a signal received from the negative output terminal of the linear amplifier; and a comparison circuit configured to operate in a first operational state to detect when the positive peak signal magnitude has exceeded a first value and when the negative peak signal magnitude has exceeded a second value, the comparison circuit further being configured to operate in a second operational state to determine if a signal is being received at the signal strength measuring differential output linear amplifier by comparing an interpolation of the positive peak signal and the negative peak signal with a third value, wherein the comparison circuit comprises logic configured to switch the comparison circuit from the first operational state to the second operational state.

* * * * *